(12) United States Patent
Yang et al.

(10) Patent No.: US 11,670,551 B2
(45) Date of Patent: Jun. 6, 2023

(54) INTERFACE TRAP CHARGE DENSITY REDUCTION

(71) Applicant: Taiwan Semiconductor Manufacturing Co., Ltd., Hsinchu (TW)

(72) Inventors: Szu-Chi Yang, Hsinchu (TW); Allen Chien, Hsinchu (TW); Cheng-Ting Ding, Hsinchu (TW); Chien-Chih Lin, Hsinchu (TW); Chien-Chih Lee, New Taipei (TW); Shih-Hao Lin, Hsinchu (TW); Tsung-Hung Lee, Hsinchu (TW); Chih Chieh Yeh, Taipei (TW); Po-Kai Hsiao, Changhua County (TW); Tsai-Yu Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 16/926,528

(22) Filed: Jul. 10, 2020

(65) Prior Publication Data
US 2021/0098305 A1    Apr. 1, 2021

Related U.S. Application Data

(60) Provisional application No. 62/906,291, filed on Sep. 26, 2019.

(51) Int. Cl.
*H01L 21/8234* (2006.01)
*H01L 21/324* (2006.01)
(Continued)

(52) U.S. Cl.
CPC ............. *H01L 21/823431* (2013.01); *H01L 21/823412* (2013.01); *H01L 21/823418* (2013.01); *H01L 29/0607* (2013.01); *H01L 29/1054* (2013.01)

(58) Field of Classification Search
CPC ..... H01L 21/823431; H01L 21/823821; H01L 27/0886; H01L 27/0924; H01L 21/845;
(Continued)

(56) References Cited

U.S. PATENT DOCUMENTS 4,615,766 A * 10/1986 Jackson ............... H01L 21/314
438/522
8,836,016 B2    9/2014 Hou et al.
(Continued)

FOREIGN PATENT DOCUMENTS

| TW | 201543667 A | 11/2015 | |
| TW | 201913756 A | 4/2019 | |
| WO | WO 2013/095384 | * 6/2013 | ............. H01L 29/78 |

OTHER PUBLICATIONS

Sprenger et al., "Electron-enhanced atomic layer deposition of silicon thin films at room temperature", J. Vac. Sci. Technol. A (36)1, Jan./Feb. 2018, pp. 01A118-1 tp 01A118-10 . . . (Year: 2018).*

*Primary Examiner* — Mary A Wilczewski
(74) *Attorney, Agent, or Firm* — Haynes and Boone, LLP

(57) ABSTRACT

The present disclosure provides methods of fabricating a semiconductor device. A method according to one embodiment includes forming, on a substrate, a first fin formed of a first semiconductor material and a second fin formed of a second semiconductor material different from the first semiconductor material, forming a semiconductor cap layer over the first fin and the second fin, and annealing the semicon-
(Continued)

ductor cap layer at a first temperature while at least a portion of the semiconductor cap layer is exposed.

20 Claims, 12 Drawing Sheets

(51) Int. Cl.
*H01L 29/78* (2006.01)
*H01L 29/06* (2006.01)
*H01L 29/10* (2006.01)

(58) Field of Classification Search
CPC ............ H01L 29/785; H01L 29/41791; H01L 27/1211; H01L 21/823807; H01L 21/823412; H01L 21/324; H01L 21/823418; H01L 21/823814; H01L 29/0607; H01L 29/1054
See application file for complete search history.

(56) References Cited

U.S. PATENT DOCUMENTS

| | | | |
|---|---|---|---|
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,190,329 B1* | 11/2015 | Cheng | H01L 21/823807 |
| 9,202,917 B2* | 12/2015 | Ching | H01L 29/785 |
| 9,236,267 B2 | 1/2016 | De et al. | |
| 9,245,805 B2 | 1/2016 | Yeh et al. | |
| 9,373,638 B1* | 6/2016 | Lauer | H01L 29/1054 |
| 9,461,174 B2* | 10/2016 | Loubet | H01L 21/845 |
| 9,484,266 B1* | 11/2016 | Balakrishnan | H01L 21/02636 |
| 9,520,482 B1 | 12/2016 | Chang et al. | |
| 9,548,386 B1* | 1/2017 | Cheng | H01L 21/308 |
| 9,576,814 B2 | 2/2017 | Wu et al. | |
| 9,847,334 B1* | 12/2017 | More | H01L 29/78 |
| 10,680,083 B2* | 6/2020 | Bao | H01L 29/785 |
| 10,699,967 B2* | 6/2020 | Ando | H01L 27/0924 |
| 10,923,403 B2* | 2/2021 | Ando | H01L 27/0924 |
| 11,031,291 B2* | 6/2021 | Chang | H01L 21/324 |
| 11,094,801 B2* | 8/2021 | Bao | H01L 21/76224 |
| 2005/0130358 A1* | 6/2005 | Chidambarrao | H01L 21/823821 438/197 |
| 2005/0255714 A1* | 11/2005 | Iyer | H01L 21/0217 438/794 |
| 2009/0090934 A1* | 4/2009 | Tezuka | H01L 29/78696 257/190 |
| 2011/0006378 A1* | 1/2011 | Hussain | H01L 21/31111 257/392 |
| 2014/0339643 A1* | 11/2014 | Cheng | H01L 29/167 257/369 |
| 2015/0021697 A1* | 1/2015 | Colinge | H01L 29/7848 438/424 |
| 2015/0028426 A1* | 1/2015 | Ching | H01L 29/66795 438/283 |
| 2015/0206744 A1* | 7/2015 | Cheng | H01L 21/02532 438/152 |
| 2015/0206904 A1* | 7/2015 | Cheng | H01L 21/02381 257/506 |
| 2016/0190137 A1* | 6/2016 | Tsai | H01L 29/66803 257/369 |
| 2016/0190168 A1* | 6/2016 | Cheng | H01L 21/02381 257/347 |
| 2016/0190303 A1* | 6/2016 | Liu | H01L 21/76224 257/192 |
| 2016/0218192 A1* | 7/2016 | Doris | H01L 27/0924 |
| 2016/0268378 A1* | 9/2016 | Hashemi | H01L 21/823412 |
| 2016/0307807 A1* | 10/2016 | Lim | H01L 21/823821 |
| 2016/0372551 A1* | 12/2016 | Doris | H01L 29/1054 |
| 2017/0005190 A1* | 1/2017 | Chang | H01L 29/78696 |
| 2017/0069543 A1* | 3/2017 | Chang | H01L 21/823814 |
| 2017/0077269 A1* | 3/2017 | Tsai | H01L 29/6653 |
| 2018/0090494 A1* | 3/2018 | Chao | H01L 29/165 |
| 2018/0315663 A1* | 11/2018 | Bao | H01L 29/785 |
| 2018/0337097 A1* | 11/2018 | Ando | H01L 21/02532 |
| 2018/0337098 A1* | 11/2018 | Ando | H01L 21/823821 |
| 2018/0337101 A1* | 11/2018 | Zhou | H01L 21/76224 |
| 2019/0148141 A1* | 5/2019 | Chen | H01L 21/02323 257/618 |
| 2019/0229020 A1 | 7/2019 | Bao et al. | |
| 2019/0245049 A1* | 8/2019 | Cheng | H01L 29/41791 |
| 2019/0295844 A1* | 9/2019 | Lee | H01L 21/823821 |
| 2020/0006533 A1* | 1/2020 | Tsai | H01L 29/7849 |
| 2020/0091319 A1* | 3/2020 | Bao | H01L 21/76205 |
| 2020/0135584 A1* | 4/2020 | Wang | H01L 21/823878 |
| 2020/0144057 A1* | 5/2020 | Lee | H01L 21/823821 |
| 2020/0168507 A1* | 5/2020 | Chang | H01L 29/66795 |
| 2020/0243670 A1* | 7/2020 | Bao | H01L 29/785 |
| 2021/0066476 A1* | 3/2021 | Kao | H01L 21/762 |
| 2021/0098305 A1* | 4/2021 | Yang | H01L 21/823418 |
| 2021/0104441 A1* | 4/2021 | Wang | H01L 21/02532 |
| 2021/0296506 A1* | 9/2021 | Wei | H01L 29/7851 |

\* cited by examiner

INTERFACE TRAP CHARGE DENSITY REDUCTION

CROSS-REFERENCE TO RELATED APPLICATION

This application claims the benefit of U.S. Provisional Application No, 62/906,291, filed Sep. 26, 2019, the entirety of which is incorporated by reference herein

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As geometry size of IC devices continues to shrink, defects that may have been largely inconsequential to performance of conventional larger devices may now substantially impact device performance. For example, p-type fully-strained channel technology has been developed to improve hole mobility in p-type transistors. A silicon cap may be formed over a p-type fully-strained channel protect undesirable oxidation of semiconductor material in the p-type channel. It has been observed that a high density of interface trap charge may be present at the interface between the silicon cap and the p-type fully-strained channel, resulting in current leakage and increase in channel resistance. Therefore, although conventional p-type fully-strained channel devices are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are riot drawn to scale. In fact, the dimensions of the various features may be arbitrarily increased or reduced for clarity of discussion.

DETAILED DESCRIPTION

Figure 1:
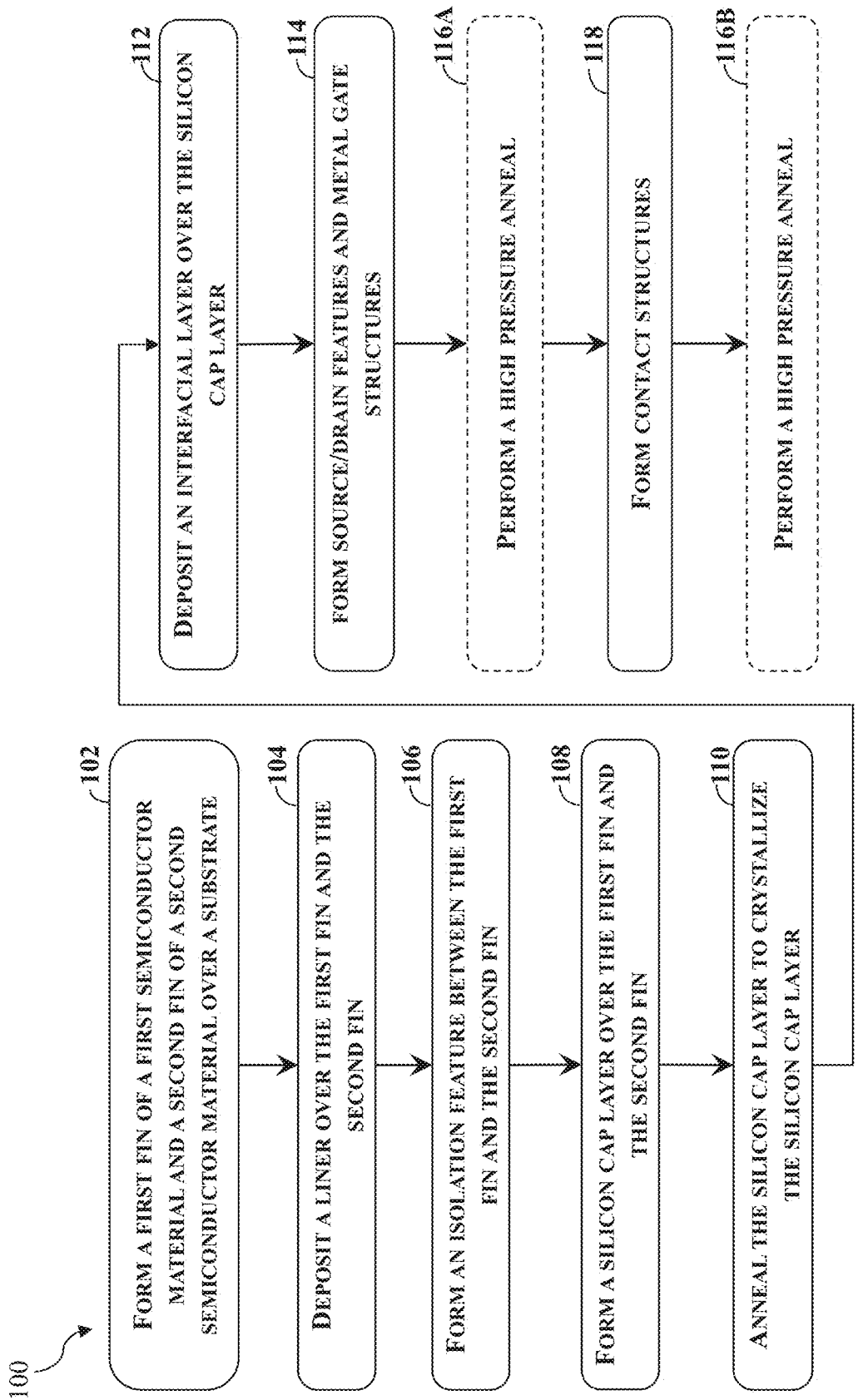
FIG. 1 is a flow chart of a method for fabricating a semiconductor device on a workpiece, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

As IC devices shrink in size, short channel effect (SCE) has prevented further scaling down of planar field effect transistors (FETs). Various multi-gate devices have been proposed to enhance gate control and prevent short channel effect. An example of these multi-gate devices is a fin-shape field effect transistor (FinFET). Further improvements of FinFETs have been put forth over the years. For instances, mobility of charge carriers (i.e. electrons in n-type devices and holes in p-type devices) may be increased by forming FinFETs with strained channels. The materials used in strained channels can be different for p-type field effect transistors (PFETs) and n-type field effect transistors (NFETs). By way of example and not limitation, electron mobility in an NFET can be enhanced with the use of fully strained silicon/carbon-doped silicon (Si/Si:C) channels, while hole mobility in PFETs can be enhanced with fully strained silicon germanium (SiGe) channels. Fully strained silicon/carbon-doped silicon (Si/Si:C) channels and fully strained silicon germanium (SiGe) channels may be formed using epitaxial growth.

The fully strained epitaxial channels can be formed from epitaxial layers disposed on a top portion of a silicon (Si) fin. The formation process of fully strained channels requires numerous photolithography, etch, pre-treatment, anneal and growth operations. To further strain the p-type channel and to prevent germanium from undesirable oxidation, a silicon cap layer may be formed over workpiece to cover the fully strained p-type channel. It has been observed that properties of the silicon cap layer affect performance of the semiconductor device. When the silicon cap layer lacks crystallinity, the silicon cap layer may oxidize too quickly and may not adequately prevent germanium content in the p-type channel from oxidation. In addition, when silicon cap layer contains defects at its interface with the p-type channel, the density of interface trap charge (DIT) may increase, resulting in leakage current, reduction in carrier mobility, and increase in channel resistance. A p-type fully strained channel (PFSC) can be susceptible to defects where the Si to SiGe lattice mismatch is larger, for example, compared to an n-type fully strained channel (NFSC) where Si, Si:C, or a combination thereof can be used.

FIG. 1 illustrate a flow chart of a method 100 for fabricating a semiconductor device on a workpiece 200. FIG. 1 will be described in conjunction with FIGS. 2-12, which illustrate fragmentary cross-sectional views of the workpiece 200 at various stages of fabrication according to various embodiments of method 100 of the present disclosure. Additional steps can be provided before, during, and after method 100, and some of the steps described can be moved, replaced, or eliminated for additional embodiments of method 100. Additional features can be added in the workpiece 200 depicted in FIGS. 2-12, and some of the features described below can be replaced, modified, or eliminated in other embodiments of the workpiece 200 depicted in FIGS. 2-12. Because a semiconductor device will be formed from the workpiece 200 after the fabrication process concludes, the workpiece 200 may also be referred to as the semiconductor device 200 from time to time throughout the present disclosure for convenience. The semiconductor device 200 can be included in a microprocessor, a memory, and/or other IC device. In some implementations, the semiconductor device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 2:
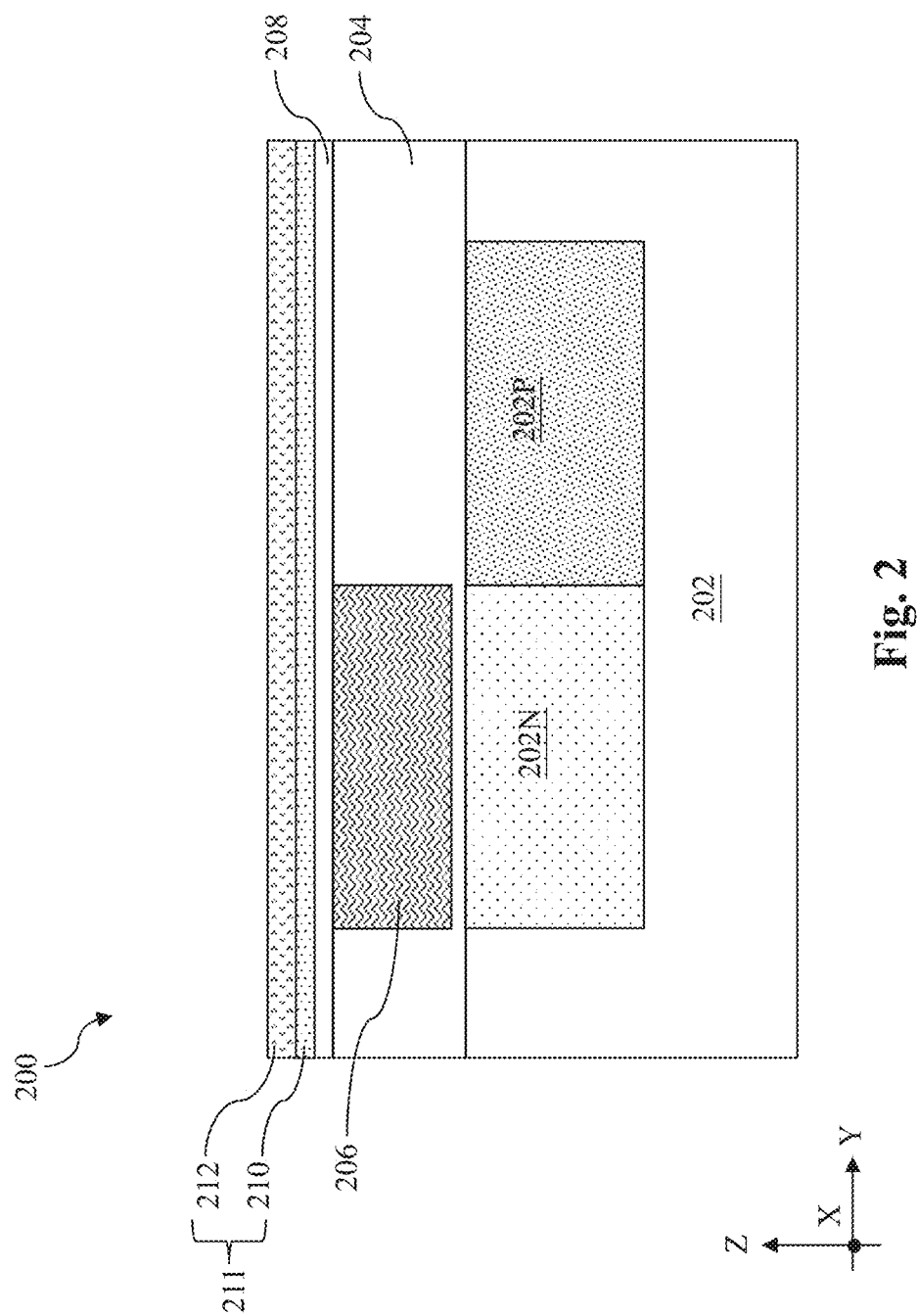
FIGS. 2-12 are fragmentary cross-sectional views of the workpiece at various steps of the method of FIG. 1, according to aspects of the present disclosure.
Figure 3:
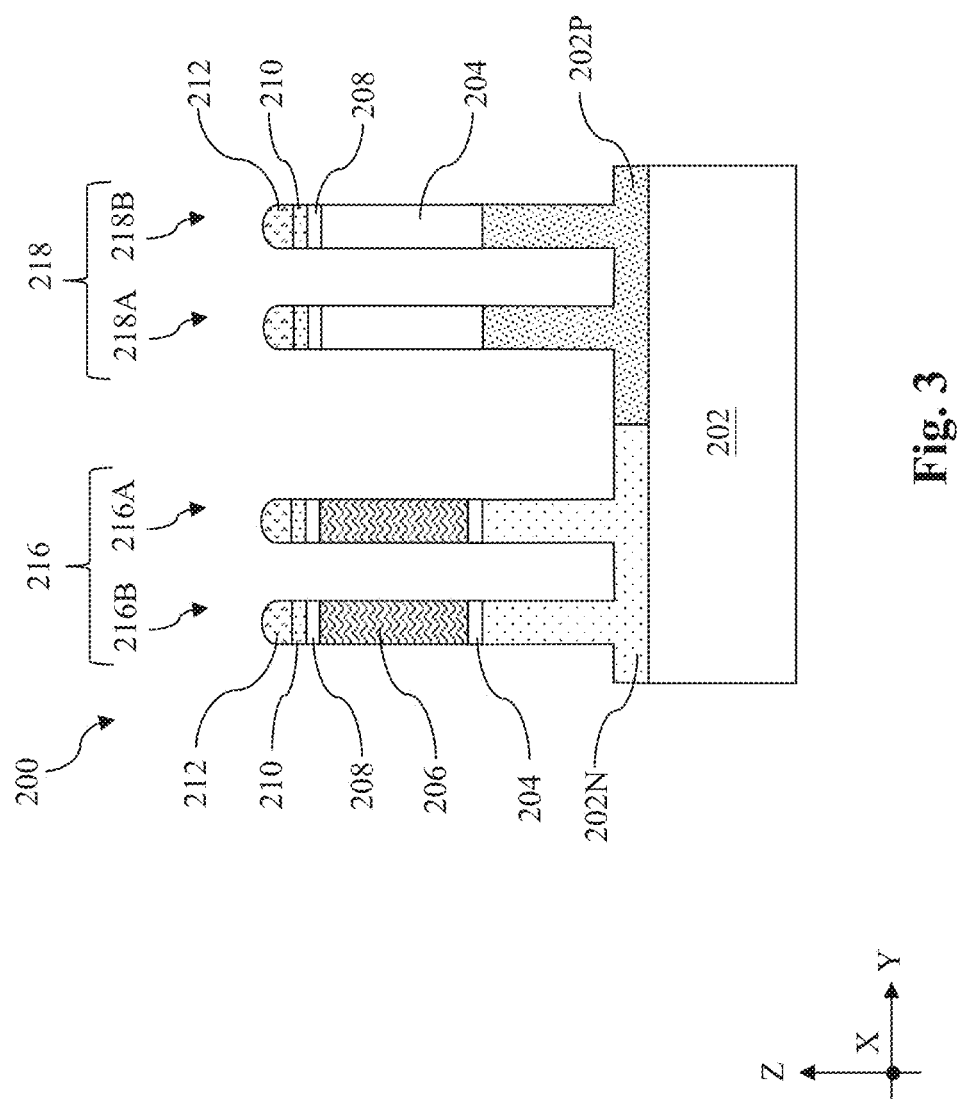

Referring to FIGS. 1, 2 and 3, the method 100 includes a block 102 where a first fin 216A of a first semiconductor material 206 and a second fin 218A of a second semiconductor material 204 over a substrate 202. Reference is first made to FIG. 2, which illustrates the substrate 202 that includes an n-type well (n-well) 202N and a p-type well (p-well) 202P. The substrate 202 may include silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In the embodiment depicted in FIG. 2, substrate 202 consists essentially of silicon. The n-well 202N include n-type dopants, such as phosphorus, arsenic, other n-type dopant, or combinations thereof. The p-well 202P include p-type dopants, such as boron, indium, other p-type dopant, or combinations thereof. The n-well 202N and p-well 202P can be formed directly on and/or in substrate 202 by ion implantation processes, diffusion processes, and/or other suitable doping process.

After the n-well 202N and the p-well 202P are formed, a layer of the first semiconductor material 206 and a layer of the second semiconductor material 204 are formed over the workpiece 200. In some embodiments, a layer of the second semiconductor material 204 is first epitaxially grown on the substrate 202, a portion of the layer of the second semiconductor material 204 is removed to form a recess, and then a layer of the first semiconductor material 206 is epitaxially grown to fill the recess. In some implementations, the layer of the second semiconductor material 204 is not directly grown from the substrate 202. In those implementations, a seed layer (not shown) may be formed on the substrate 202 and the layer of the second semiconductor material 204 is then formed on the seed layer. In some embodiments, the second semiconductor material 204 may include silicon, carbon, or a combination thereof. In some embodiments, the first semiconductor material 206 may include silicon, germanium, or a combination thereof. In some instances where the first semiconductor material 206 includes silicon and germanium, a germanium content of the first semiconductor material 206 may be between 20% and 80%. An example where the second semiconductor material 204 is formed of silicon is described below for illustration purposes. The layer of the second semiconductor material 204 is epitaxially grown to a thickness between about 50 nm to about 100 nm using source gases such as silane ($SiH_4$), silicon tetrachloride ($SiCl_4$), trichlorosilane (TCS), or dichlorosilane ($SiH_2Cl_2$ or DCS). Hydrogen ($H_2$) can be used as a reactant gas that reduces the aforementioned source gases. The deposition temperature during the epitaxial layer formation can range from about 700° C. to about 1250° C. depending on the gases used. For example, source gases with fewer chlorine atoms (e.g., DCS) may require lower formation temperatures compared to source gases with more chlorine atoms, such as $SiCl_4$ or TCS. The aforementioned ranges and type of gases are provided as examples and are not limiting. To form a recess in the layer of the second semiconductor material 204, a hard mask formed of a dielectric material may be formed thereover. The hard mask may be formed of silicon oxide or silicon nitride. A photolithography process is then performed to pattern the hard mask. An etch process is then performed using the patterned hard mask as an etch mask to etch the recess in the layer of the second semiconductor material 204. The etch process may be a dry etch process or a wet etch process with suitable etching chemistry. In some instances, the etch process forming the recess does not remove all of the second semiconductor material 204 at the bottom of the recess such that a thickness of the second semiconductor material 204 at the bottom may serve as a seed layer for the first semiconductor material 206 that fills the recess. A layer of the first semiconductor material 206 is then formed to fill the recess in the layer of the second semiconductor material 204. According to some embodiments, the layer of the first semiconductor material 206 is epitaxially grown at a temperature between about 550° C. to about 700° C. using precursor gases such as $SiH_4$, $Si_2H_6$, $SiH_2Cl_2$, $GeH_4$, HCl, or a combination thereof, and reactant gases such as H2, N2, or Ar, or a combination thereof.

After the first semiconductor material 206 is epitaxially grown to fill the recess in the layer of the second semiconductor material 204, a planarization process, such as a chemical mechanical polishing (CMP), may be performed to planarize the top surface of the first semiconductor material 206 and the second semiconductor material 204 such that they are coplanar. In some embodiments, after the planarization process, the first semiconductor material 206 has a thickness between about 45 nm and about 70 nm. Thereafter, silicon top layer 208 is epitaxially grown to a thickness between about 1.5 nm and about 5 nm over the planarized top surfaces of the first semiconductor material 206 and the second semiconductor material 204. In some implementations, the as deposited silicon top layer 208 may be trimmed by etching back or polishing to a reduced thickness between about 0.5 nm and about 4 nm.

To form the first fin 216A and the second fin 218A shown in FIG. 3, a hard mask 211 (FIG. 2) may be deposited over the silicon top layer 208. The hard mask 211 may be a single layer or a multilayer. In the embodiments represented in FIG. 2, the hard mask 211 is a multilayer that includes a first hard mask layer 210 and a second hard mask layer 212. The first hard mask layer 210 and the second hard mask layer 212 have different compositions. In some embodiments, the first hard mask layer 210 is formed of silicon oxide and the second hard mask layer 212 is formed of silicon nitride. In some implementations, a combination of deposition, lithography and/or etching processes are performed to define the first fin 216A and the second fin 218A over the substrate 202. For example, forming the first fin 216A and the second fin 218A includes performing a lithography process to form a patterned resist layer over the hard mask 211 and performing an etching process to transfer a pattern defined in the patterned resist layer to the hard mask 211. The lithography process can include forming a resist layer on the hard mask 211, performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the hard mask 211. The etching process can include a dry etching process (for example, a reactive ion etching (RIE) process), a wet etching process, other suitable etching process, or combinations thereof. After the etching process, the patterned resist layer is removed from substrate 202, for example, by a resist stripping process. Alternatively, first fin 216A and the second fin 218A are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming first fin 216A and the second fin 218A. Further, in some implementations, the exposure process can implement maskless lithography, electron-beam (e-beam) writing, ion-beam writing, and/or nanoimprint technology for patterning the resist layer and/or other layers.

In some embodiments represented in FIG. 3, the semiconductor device 200 includes double-fin transistors and two fins are formed over each of the n-well 202N and the p-well 202P. In these embodiments, the first fin 216A and an adjacent fin 216B are formed over the n-well 202N and the second fin 218A and an adjacent fin 218B are formed over the p-well 202P. The first fin 216A and the adjacent fin 216B may be collectively referred to as p-type fins 216 and the second fin 218A and the adjacent fin 218B may be collectively referred to as n-type fins 218. The p-type fins 216 serve as p-type active regions for formation of p-type transistors with p-type fully-strained channels. The n-type fins 218 serve as n-type active regions for formation of n-type transistors with n-type channels or strained n-type channels. However, the present disclosure is not to be construed restrictively. With reference to the present disclosure, a person of ordinary skill in the art would appreciate that the methods and devices disclosed in the present disclosure are readily applicable to semiconductor devices that include single-fin or multi-fin (i.e., having more than 3 fins per transistor) transistors.

Figure 4:
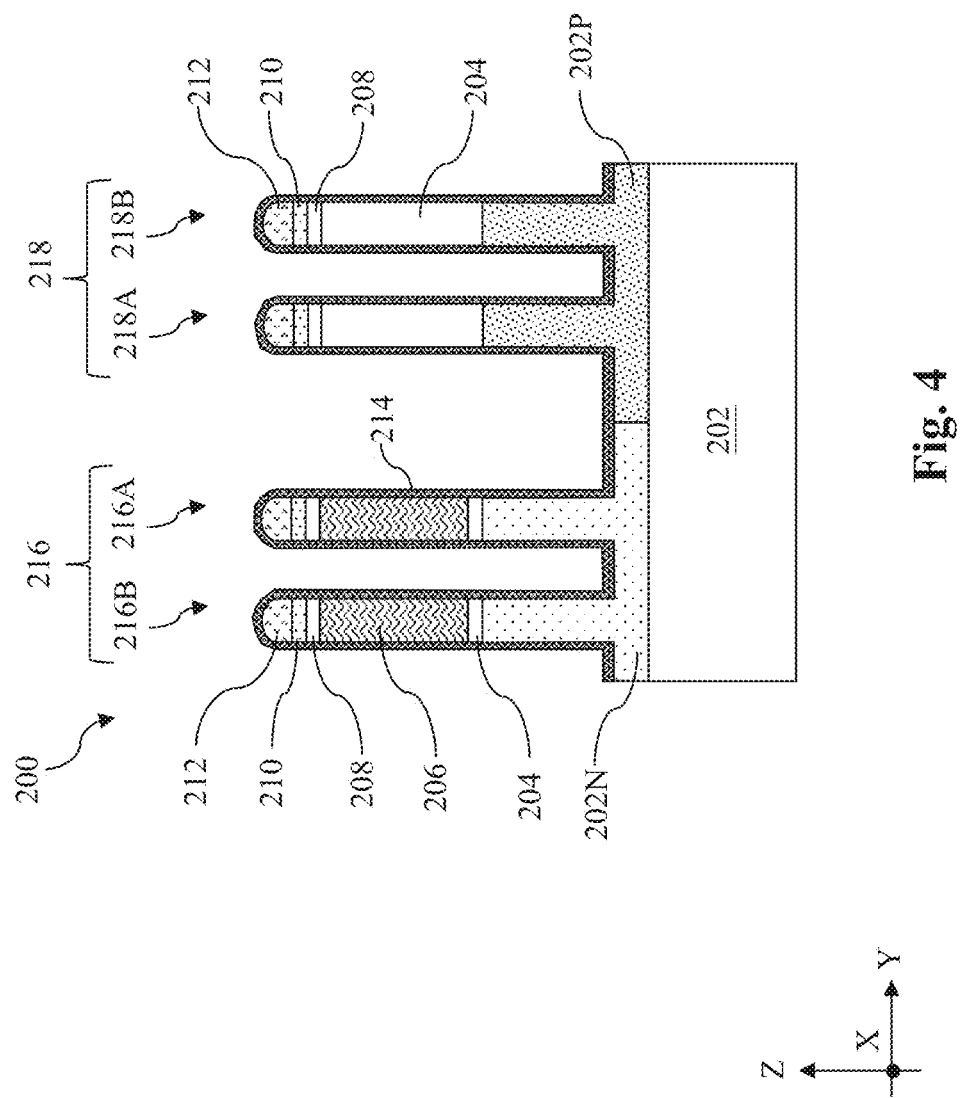

Referring now to FIGS. 1 and 4, the method 100 includes a block 104 where a liner 214 is formed over the first fin 216A and the second fin 218A. The liner 214 serves to provide structural support to the first fin 216A and the second fin 218A during subsequent processes. In some embodiments, the liner 214 may be formed of silicon nitride to a thickness between about 0.5 nm and about 3 nm. In some implementations, the liner 214 may be formed using atomic layer deposition (ALD) or chemical vapor deposition (CVD).

Figure 5:
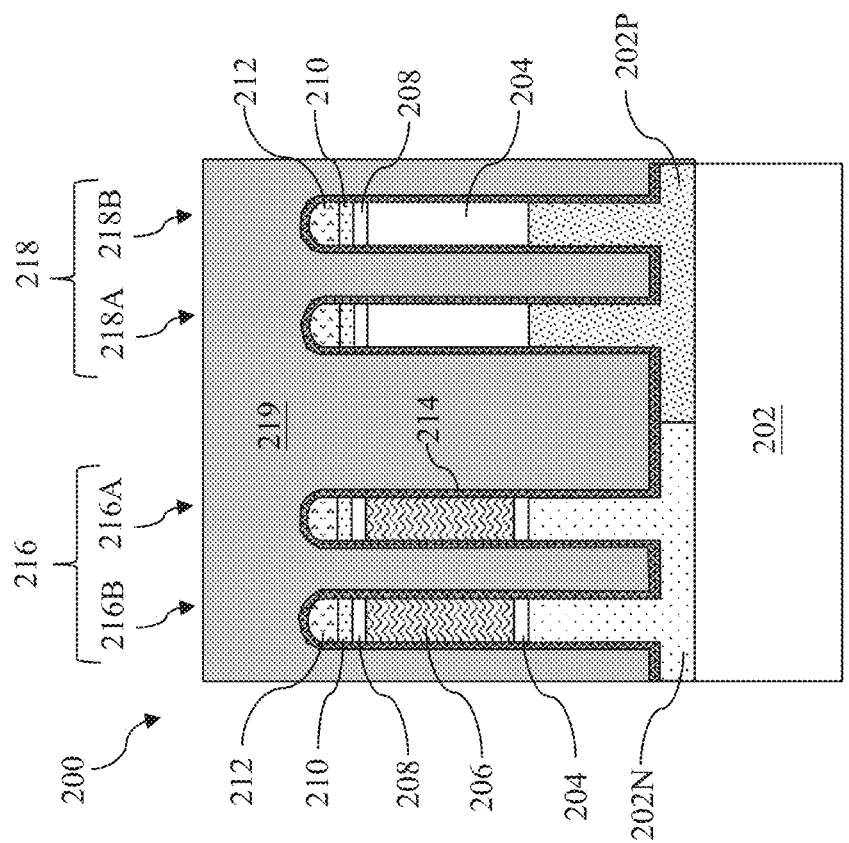
Figure 6:
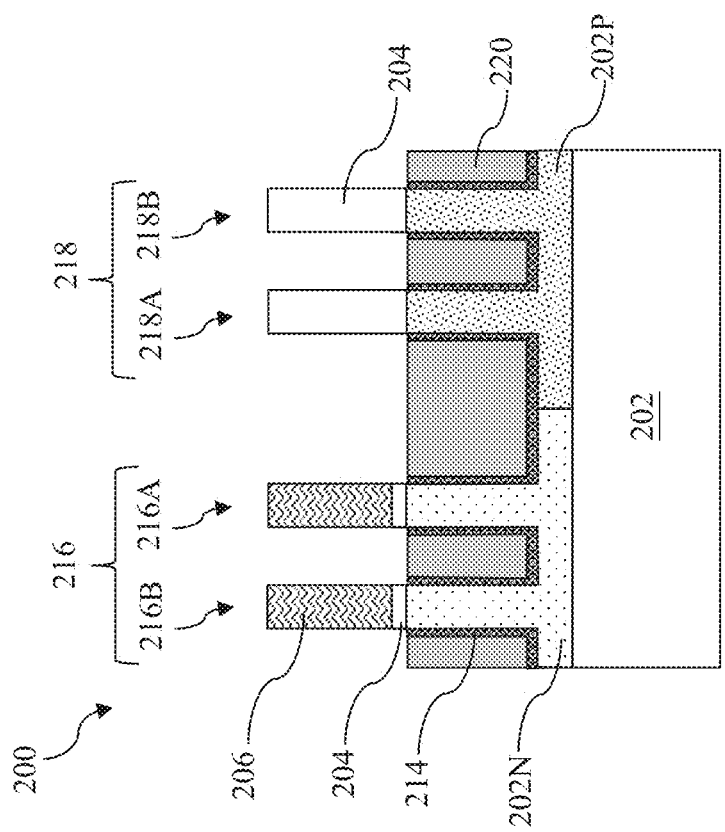

Referring to FIGS. 1, 5 and 6, the method 100 includes a block 106 where an isolation feature 220 between the first fin 216A and the second fin 218A. In some embodiments represented in FIG. 5, a dielectric material 219 is first blanketly deposited over the workpiece 200 to fill space between the p-type fins 216 and the n-type fins 218. The dielectric material 219 may include silicon oxide, silicon oxynitride, other suitable isolation material, or combinations thereof and may be deposited by chemical vapor deposition (CVD) or a spin-on-glass (SOG) process. A planarization process, such as a CMP process, is then performed until the hard mask layer 211 is removed. Referring now to FIG. 6, the planarized dielectric material 219 is then etched back to form the isolation structure 220. As shown in FIG. 6, the first semiconductor material 206 and the second semiconductor material 204 in the first fin 216A and the second semiconductor material 204 in the second fin 218A are exposed and rise above the isolation structure 220. In embodiments represented in FIG. 6, the isolation structure 220 is a shallow trench isolation (STI) structure and may be referred to as STI structure 220. However, the present disclosure envisions implementations of other types of isolation structure, such as deep trench isolation (DTI) structures and local oxidation of silicon (LOCOS) structures, so long as such implementation does not hinder formation of semiconductor devices with strained channels. In some embodiments, the etching back of the dielectric material 219 also removes the liner 214 without substantially etching the isolation structure 220, the first semiconductor material 206 and the second semiconductor material 204. In some other embodiments, a separate etch process is performed to selectively remove the liner 214. In embodiments where the liner 214 is formed of silicon nitride, the separate etch process is configured to selectively etch silicon nitride.

Figure 7:
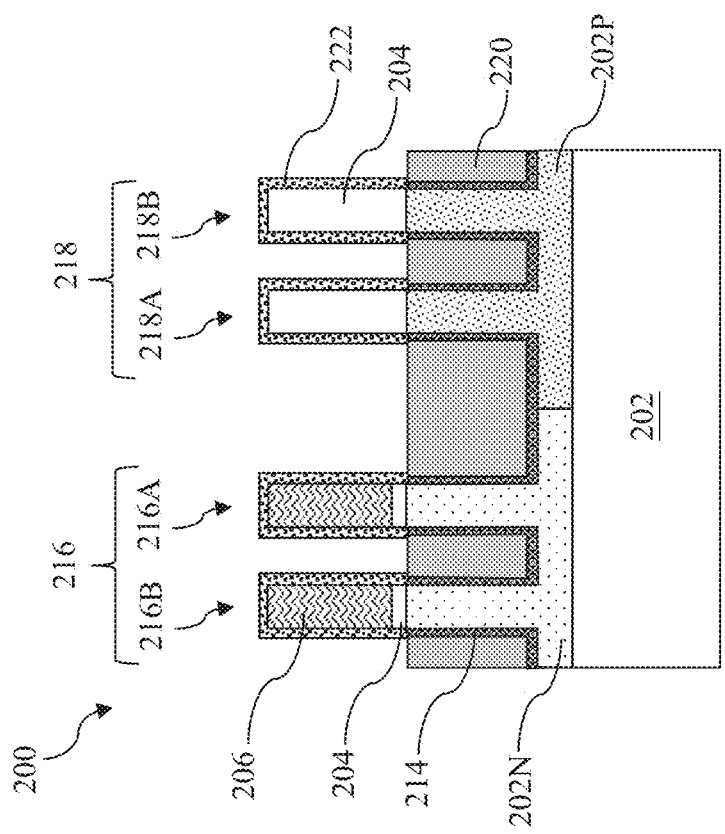

Referring to FIGS. 1 and 7, the method 100 includes a block 108 where a silicon cap layer 222 is formed over the first fin 216A and the second fin 218A, The silicon cap layer 222 may be deposited using suitable deposition techniques, such has atomic layer deposition (ALD) or epitaxial growth. In some implementations, the silicon cap layer 222 may be epitaxially grown to a thickness between about 0.5 nm and about 5 nm using source gases such as silane ($SiH_4$), silicon tetrachloride ($SiCl_4$), trichlorosilane (TCS), or dichlorosilane ($SiH_2Cl_2$ or DCS). Hydrogen ($H_2$) can be used as a reactant gas that reduces the aforementioned source gases. The deposition temperature during the epitaxial layer formation can range from about 380° C. to about 1250° C. depending on the gases used. For example, source gases with fewer chlorine atoms (e.g., DCS) may require lower formation temperatures compared to source gases with more chlorine atoms, such as $SiCl_4$ or TCS. In some other implementations, the silicon cap layer 222 may be formed using ALD to a similar thickness range between about 0.5 nm and about 5 nm using similar gas precursors. The difference between ALD and epitaxial grown lies primarily in that alternating self-limiting monolayers are formed in the former and the same are not necessarily formed in the latter. Other differences may include reactor types and process conditions. In some embodiments, the silicon cap layer 222 is first formed to a first thickness and then recessed to a smaller second thickness that falls with the thickness range between about 0.5 nm and about 5 nm.

Figure 8:
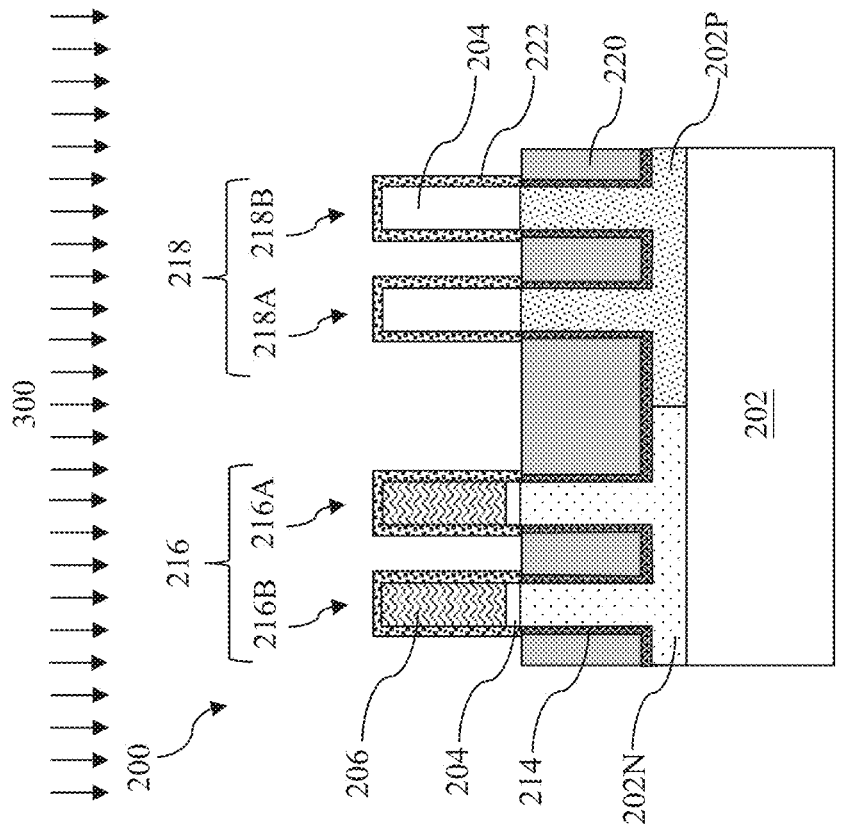

Referring to FIGS. 1 and 8, the method 100 includes a block 110 where the silicon cap layer 222 undergoes an anneal process 300 to crystallize the silicon cap layer 222. In some embodiments, the anneal process 300 at block 110 is performed using radiation heating at a first temperature (T1) between about 800° C. and about 1050 C. The disclosed temperature range is critical to the anneal process 300 at block 110. When the first temperature (T1) of the anneal process 300 is below 800° C., little or no reflow of silicon may take place to improve crystallinity of the silicon cap layer 222 and to reduce density of interfacial trap charge between the silicon cap layer 222 and the first semiconductor layer 206. When the first temperature (T1) of the anneal process 300 is above 1050° C., the p-type fins 216 (including the first fin 216A) and n-type fins 218 (including the second fin 218A) may be damaged. The anneal process 300 at block 110 may be performed at a first pressure (P1) between about 0.001 atmosphere (atm) and about 1.1 atm. It has been observed that a finite amount of oxygen may be needed when the anneal pressure of the anneal process 300 is well below 1 atm, such as at 0.02 atm, to control reflow of the silicon cap layer 222. As both low pressure and lack of oxygen would increase silicon diffusivity in the silicon cap layer 222, the finite amount of oxygen may prevent too much silicon from reflow that may result in non-uniform thickness in the silicon cap layer 222. Such a finite amount of oxygen is not needed when the first pressure (P1) of the anneal process 300 is at or around 1 atm, such as at 1.02 atm. The anneal process 300 at block 110 may be performed in a gas ambient that includes only nitrogen, substantially free of oxygen. When the first pressure (P1) at block 110 is well below 1 atm, the gas ambient includes nitrogen and oxygen, with an oxygen content at between about 0.01% and about 0.05%, such as at about 0.025%. When the first pressure (P1) of the anneal process 300 is at or around 1 atm, the gas ambient include nitrogen only. In some instances, more than one purging operation may be needed to intentionally remove oxygen gas from the gas ambient when the first pressure (P1) of the anneal process 300 is at or around 1 atm. Because the anneal process 300 is performed after formation of the silicon cap layer 222, the anneal process 300 may be referred to as the post-silicon-cap anneal (PSA) 300. It has been observed that PSA process 300 may effectively reduce the density of interface trap charge (DIT) at the interface between silicon cap layer 222 and the first semiconductor material 206 and to improve crystallinity of the silicon cap layer 222. Transmission electron microscope (TEM) images show that a more clear-cut interface between the silicon cap layer 222 and the first semiconductor material 206 may be formed as a result of the PSA process 300. The DIT is reduced because lattice defects and dislocation at the interface are reduced in the PSA at block 110. Because the rate of oxidation of silicon decreases with crystallinity, the improved crystallinity of the silicon cap layer 222 slows down the oxidation rate and provides the first semiconductor layer 206 with better protection from undesirable oxidation.

Because the PSA at block 110 is performed before formation of source/drain features, metal gate stacks, and other metal-containing contact features, the relatively high first temperature T1 (i.e., between about 800° C. and about 1050° C.) of PSA does not come with any risk of exceeding thermal budget or causing thermal damages to the aforementioned structures.

Figure 9:
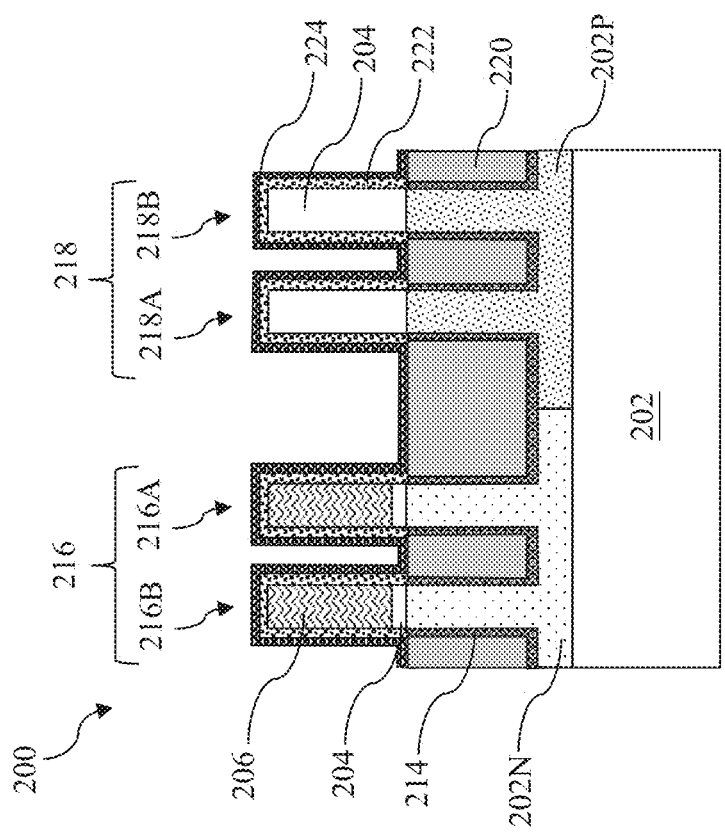

Referring to FIGS. 1 and 9, the method 100 includes a block 112 where an interfacial layer 224 is deposited over the silicon cap layer 222. In some embodiments, the interfacial layer 224 includes silicon oxide and is deposited on the silicon cap layer 222 using a suitable deposition process, such as chemical vapor deposition (CVD) or atomic layer deposition (ALD). In some implementations, an anneal process may be performed to anneal the deposited interfacial layer 224 to reduce imperfections and improve quality of the interfacial layer 224.

Figure 10:
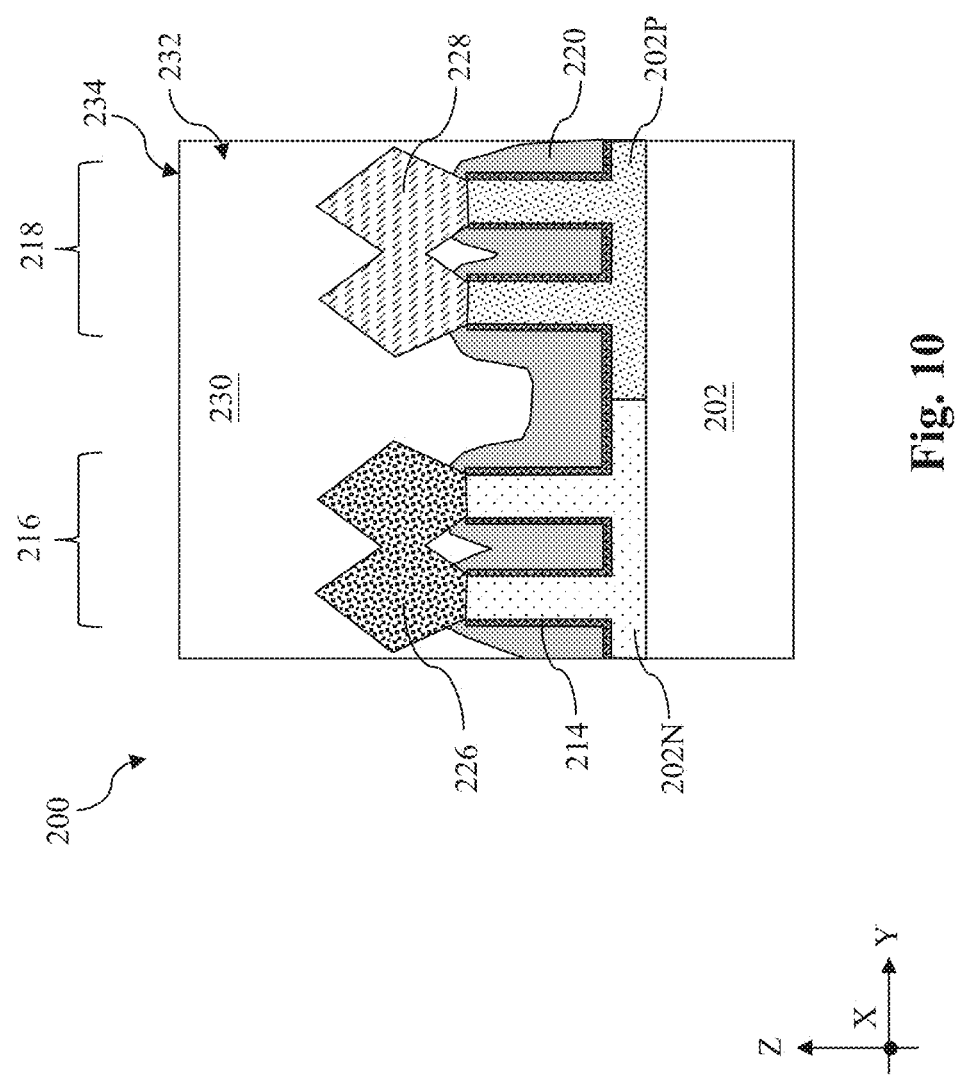

Referring now to FIGS. 1 and 10, the method 100 includes a block 114 where source/drain features 226, 228 and a metal gate stack 234 are formed. The metal gate stack 234 may be formed using a gate first process or a gate last process. The latter is described below as an example and the former is fully envisioned. In a gate last process, a dummy gate stack (not shown) may be first formed over the p-type fins 216 and the n-type fins 218 such that the dummy gate stack wraps around each of the p-type fins 216 and the n-type fins 218 and engage its top surface and side surfaces. In some instances, the dummy gate stack may include polysilicon and may be formed on the interfacial layer 224 (illustrated in FIG. 9). After the dummy gate stack is formed, a gate spacer 230 may be deposited over the dummy gate stack. Thereafter, a dielectric layer (not shown) is deposited over the workpiece 200 to cover the dummy gate stack, the p-type fins 216 and the n-type fins 218 and then planarized to form a level top surface. In some embodiments, photolithography processes may be then performed to sequentially expose and recess source/drain regions of the p-type fins 216 and the n-type fins 218 to form p-type source/drain features 226 and n-type source/drain feature 228. Epitaxial source/drain features may then be disposed in recessed source/drain regions of the p-type fins 216 and the n-type fins 218. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In some implementations, P-type epitaxial source/drain feature 226 may be formed of silicon germanium doped with p-type dopants, such boron. N-type epitaxial source/drain features 228 may be formed of silicon or Si:C doped with n-type dopants, such as phosphorus. In some implementations, annealing processes are performed to activate dopants in epitaxial source/drain features 226 and 228 of the semiconductor device 200. According to some implementations, after the epitaxial source/drain features 226 and 228 are deposited, a contact etch stop layer (CESL, not shown) may be deposited over the p-type source/drain feature 226 and the n-type source/drain feature 228. The CESL layer may be formed of silicon nitride or silicon carbonitride. Thereafter, an interlayer dielectric layer (ILD) 232 may be deposited over the workpiece 200 to cover the p-type source/drain features 226 and n-type source/drain feature 228. The ILD 232 may be formed of silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some implementations, the ILD 232 may be formed by flowable CVD (FCVD) or spin-on coating. For ease of illustration, ILD 232 is made transparent in FIG. 10 to show the gate spacer 230.

The ILD 232 is planarized using a suitable process such a CMP process until the dummy gate stack is exposed. In the example gate last process described herein, gate replacement operations are then performed to replace the dummy gate with a metal gate stack 234. First, the dummy gate stack and/or a portion of the interfacial layer 224 is removed to form a gate trench. Then the metal gate stack 234 is deposited in the gate trench. In some embodiments, the metal gate stack 234 may include a gate dielectric layer and a gate electrode over the gate dielectric layer. In some implementations, the gate dielectric layer may include a silicon oxide layer and a high-k dielectric layer. The silicon oxide layer may be the leftover interfacial layer 224 or may be formed anew when all or a substantial portion of the interfacial layer 224 is removed. The high-k dielectric layer is formed of a dielectric material having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the high-k dielectric layer may include, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof, The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. It is noted that the metal gate stack 234 is hidden behind the gate spacer 230 when viewed along the X direction.

Figure 11:
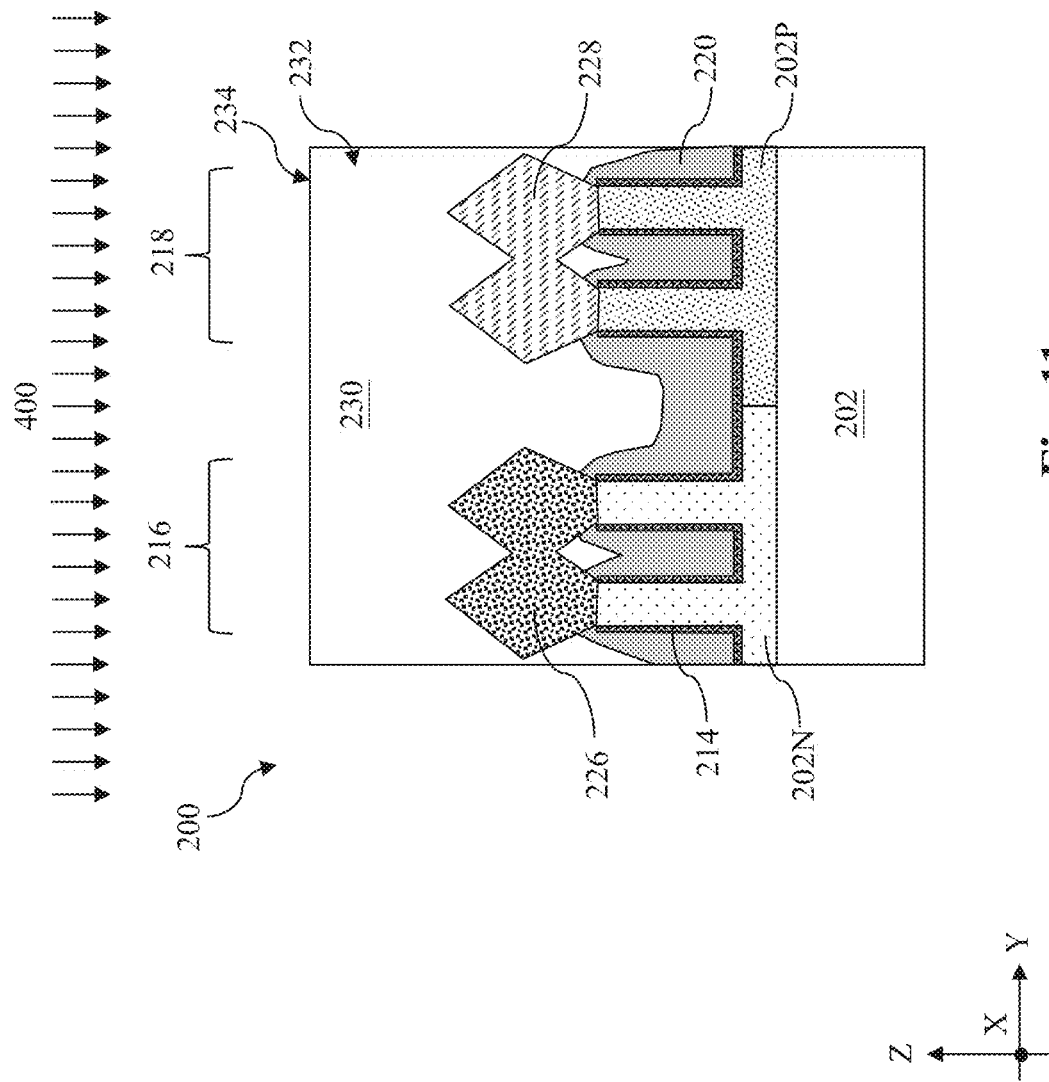

Referring now to FIGS. 1 and 11, the method 100 includes a block 116A where a high pressure anneal (HPA) process 400 is performed to the workpiece 200. In some embodiments, the HPA process 400 may be performed after formation of the source/drain features 226, 228 and a metal gate stack 234 at block 114. In some other embodiments, the method 100 may alternatively include a block 116B (rather than block 116A) where the HPA process 400 is performed after the block 118 (to be described below). IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming active regions, isolation features, gate structures, and source/drain features. MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated in FEOL and MEOL processes. In view of the IC manufacturing process flow described above, the PSA process 300 at block 110 takes place at the FEOL level or is an FEOL process; the HPA process 400 at block 116A takes place at the MEOL level or is an MEOL process; and the HPA process 400 at block 116B takes place at the BEOL level or is a BEOL process.

In either in the block 116A or the block 116B, the HPA process 400 may be performed by means of convection heating at a second temperature (T2) between about 350° C. and about 450° C., at a second pressure (P2) between about 10 atm and about 20 atm, and in a gas ambient including hydrogen. As compared to the parameters for the PSA process 300, the second temperature (T2) of the HPA process 400 is smaller than the first temperature (T1) of the PSA process 300, and the second pressure (P2) of the HPA process 400 is greater than the first pressure (P1) of the PSA process 300. The elevated second pressure (P2) is necessary to drive hydrogen from structure adjacent to channel regions into the channel regions. As compared to the PSA process 300, the second temperature (T2) of the HPA process 400 may not exceed 450° C. to avoid reflow or damages to metal-containing structures formed at the BEOL or the MEOL levels.

Figure 12:
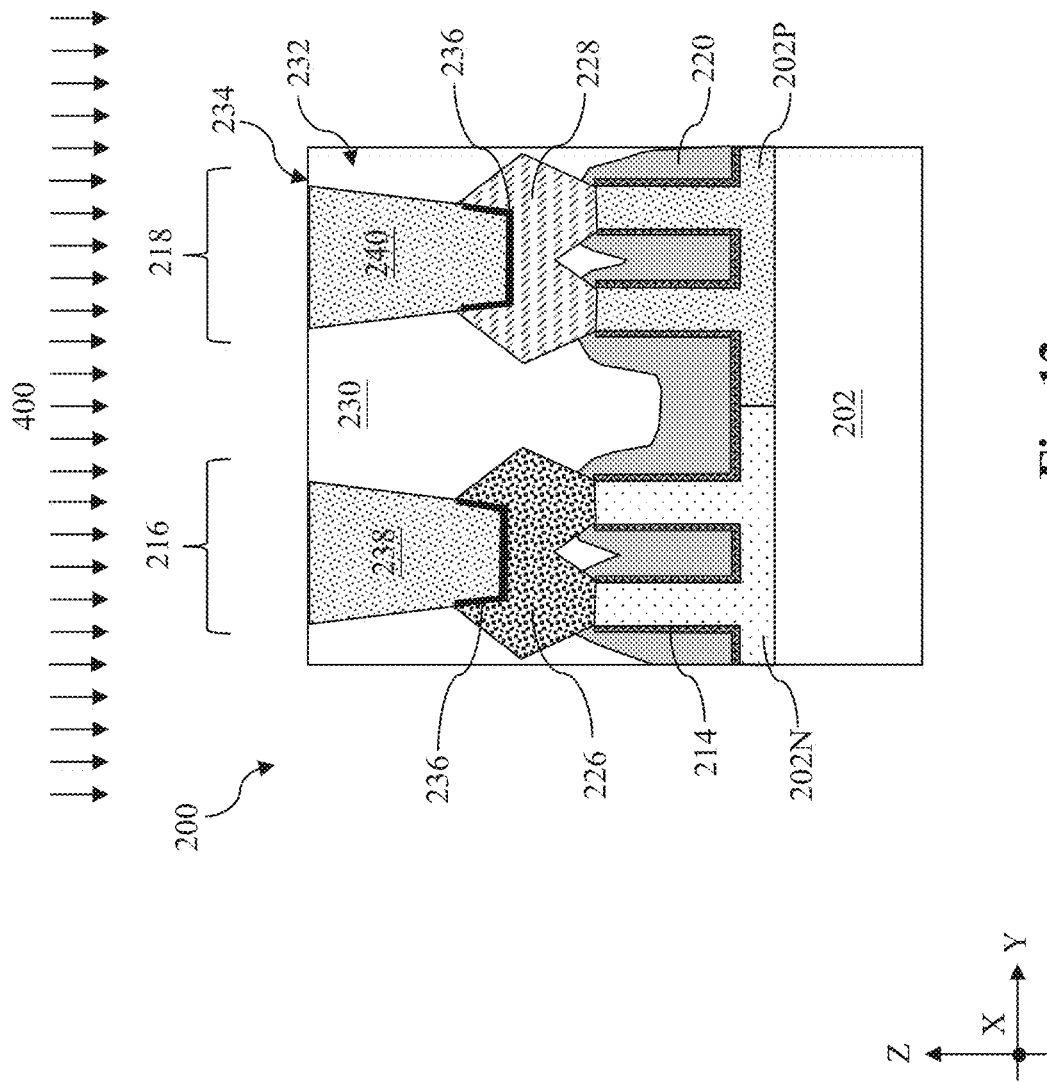

Referring now to FIGS. 1 and 12, the method 100 includes a block 118 where further processes are performed. As described above, such further processes include formation of additional interlayer dielectric layers (ILDs) and contact features formed in the additional ILDs. Example of the contact features may include gate contacts to the metal gate stack (e.g., the metal gate stack 234 in FIG. 10), source/drain contacts 238 and 240 to the source/drain features (e.g., the p-type source/drain feature 226 and the n-type source/drain feature 228 in FIG. 10), gate contact vias coupling gate contacts to overlying conductive layers, source/drain contact vias coupling source/drain contacts to overlying conductive layers, or conductive rail structures connecting various source/drain/gate contacts. For ease of illustration, only source/drain contacts 238 and 240 are illustrated in FIG. 12. In some implementations, the contact feature may include a barrier layer, a liner and a metal fill layer. The barrier layer may be formed of Ta, TaN, TaC, Ti, TiN, TiC, and other suitable material that can block oxygen diffusion. The liner may be formed of suitable metal, metal nitride, or metal carbide, such as Co, CoN and RuN. The metal fill layer may be formed of any suitable conductive material, such as W, Ni, Ta, Ti, Al, Cu, Co, TaN, TiN, Ru, and/or other suitable conductive materials. The contact features are configured to route signals between devices of the semiconductor device 200 and/or distribute signals (for example, clock signals, voltage signals, and/or ground signals) to the devices of the semiconductor device 200.

In some implementations illustrated in FIG. 12, a silicide layer 236 may be formed on the recessed p-type source/drain features 226 and n-type source/drain feature 228. In some implementations, the silicide layer 236 is formed by depositing a metal layer over the p-type source/drain features 226 and n-type source/drain feature 228. The metal layer includes any material suitable for promoting silicide formation, such as nickel, platinum, palladium, vanadium, titanium, cobalt, tantalum, ytterbium, zirconium, other suitable metal, or combinations thereof. The semiconductor device 200 is then heated (for example, subjected to an annealing process) to cause constituents of the p-type source/drain features 226 and n-type source/drain feature 228 (for example, silicon and/or germanium) to react with the metal. The silicide layers thus include metal and a constituent of the p-type source/drain features 226 and n-type source/drain feature 228 (for example, silicon and/or germanium). In some implementations, the silicide layer 236 includes nickel silicide, titanium silicide, or cobalt silicide. Any un-reacted metal, such as remaining portions of the metal layer, is selectively removed by any suitable process, such as an etching process. Operations of block 116B in FIG. 1 are illustrated in FIG. 12. As described above, the HPA process 400 may be performed after operations of block 118 are performed to form contact features that contain metal.

Methods of the present disclosure provide advantages. The PSA process performed after formation of the silicon cap layer but before formation of metal gate stacks and contact features may include high anneal temperature to crystallize the silicon cap layer and to reduce DIT due to formation of the silicon cap layer, without causing reflow or damages to the metal gate stack and metal-containing contact features. The HPA process performed at the MEOL or the BEOL level may include high pressure to drive hydrogen into the channel regions and to reduce DIT due to processes performed after the PSA process. The two-stage DIT reduction disclosed in the present disclosure suppresses DIT, reduces low-field scattering, increases hole mobility, reduces sub-threshold swing, and reduces channel resistance. In some embodiments, channel resistance in a p-type fully strained channel (such as a channel region formed in the p-type fins 216) may be reduced by between about 5% and about 10%, when PSA process is performed in addition to the HPA process. Experimental data prove that such reduction in channel resistance is independent from channel length. In some instances, it is observed that the 5% to 10% reduction in channel resistance may approximately result in between about 5% and about 10% of increase in hole mobility.

The present disclosure provides embodiments of methods of fabricating semiconductor devices. In one embodiment, a method is provided. The method includes forming, on a substrate, a first fin formed of a first semiconductor material and a second fin formed of a second semiconductor material different from the first semiconductor material, forming a semiconductor cap layer over the first fin and the second fin, and annealing the semiconductor cap layer at a first temperature while at least a portion of the semiconductor cap layer is exposed.

In some embodiments, the first fin includes a p-type channel region, the second fin includes an n-type channel region, the first semiconductor material includes germanium, and the second semiconductor material includes silicon. In some implementations, the semiconductor cap consists essentially of silicon. In some instances, the first temperature is greater than 800° C. In some embodiments, the first temperature is between about 800° C. and about 1050° C. In some embodiments, the forming of the semiconductor cap layer includes depositing silicon using atomic layer deposition (ALD). In some implementations, the forming of the semiconductor cap layer includes epitaxially growing silicon over the first fin and the second fin. In some examples, the annealing of the semiconductor cap layer increases crystallinity of the semiconductor cap layer.

In another embodiment, a method is provided. The method includes A method includes forming, on a substrate, a first fin including silicon and germanium, forming, on the substrate, a second fin including silicon, forming a silicon cap layer over the first fin and the second fin, performing a first anneal at a first temperature and a first pressure while at least a portion of the silicon cap layer is exposed, forming source/drain features over source/drain regions of the first fin and the second fin, forming a gate structure over channel regions of the first fin and the second fin, and after the forming of the gate structure, performing a second anneal at a second temperature and a second pressure while no portion of the silicon cap layer is exposed.

In some embodiments, the first temperature is greater than the second temperature and the second pressure is greater than the first pressure. In some implementations, a germanium content in the first fin is between about 20% and about 60%. In some instances, the forming of the silicon cap layer includes depositing silicon using atomic layer deposition (ALD). In some embodiments, the forming of the silicon cap layer includes epitaxially growing silicon over the first fin and the second fin. In some implementations, the first temperature is between about 800° C. and about 1050° C. and the first pressure is between about 0.01 atmosphere (atm) and about 1.1 atm. In some embodiments, the second temperature is between about 350° C. and about 450° C. and the second pressure is between about 10 atmosphere (atm) and about 20 atm. In some instances, the gate structure includes a high-k dielectric layer, a work function layer, and a metal fill layer.

In still another embodiment, a method is provided. The method includes forming, on a substrate, a first fin including silicon and germanium, forming, on the substrate, a second fin including silicon, forming a silicon cap layer over the first fin and the second fin, and immediately after the forming of the silicon cap layer, performing a first anneal at a temperature between about 800° C. and about 1050° C.

In some embodiments, the forming of the silicon cap layer includes depositing silicon using atomic layer deposition (ALD). In some implementations, the forming of the silicon cap layer includes epitaxially growing silicon over the first fin and the second fin. In some instances, the method further includes forming a gate structure over channel regions of the first fin and the second fin, and after the forming of the gate structure, performing a second anneal at a temperature between about 350° C. and about 450° C.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming, on a substrate, a first fin formed of a first semiconductor material and a second fin formed of a second semiconductor material different from the first semiconductor material;
    depositing a semiconductor nitride liner over the substrate and sidewalls of the first fin and the second fin;
    forming an isolation feature over the semiconductor nitride liner and between the first fin and the second fin;
    after the forming of the isolation feature, epitaxially depositing a silicon cap layer along the sidewalls of the first fin and the second fin using a silicon-containing source gas; and
    annealing the silicon cap layer at a first temperature while at least a portion of the silicon cap layer is exposed.

2. The method of claim 1, wherein the first fin comprises a p-type channel region, wherein the second fin comprises an n-type channel region, wherein the first semiconductor material comprises germanium, wherein the second semiconductor material comprises silicon.

3. The method of claim 1, wherein the epitaxially depositing of the silicon cap layer comprises use of silane (SiH4), silicon tetrachloride (SiC14), trichlorosilane (TCS), or dichlorosilane (SiH2C12).

4. The method of claim 1, wherein the first temperature is greater than 800° C.

5. The method of claim 1, wherein the first temperature is between about 800° C. and about 1050° C.

6. The method of claim 1, wherein the epitaxially depositing of the silicon cap layer comprises depositing silicon using atomic layer deposition (ALD).

7. The method of claim 1, wherein the annealing of the silicon cap layer increases crystallinity of the silicon cap layer.

8. The method of claim 1, wherein the forming of the isolation feature comprises:
    blanketly depositing a dielectric layer over the semiconductor nitride liner;
    planarizing the dielectric layer to expose the first fin and the second fin; and
    etching back the dielectric layer to form the isolation feature such that a portion of the first fin and a portion of the second fin rise above the isolation feature.

9. The method of claim 1, further comprising:
    after the annealing, depositing an interfacial layer over the silicon cap layer; and
    forming a polysilicon dummy gate stack over the interfacial layer, wherein the interfacial layer comprises silicon oxide.

10. A method, comprising:
    forming, on a substrate, a first fin comprising silicon and germanium;
    forming, on the substrate, a second fin comprising silicon;
    forming a silicon cap layer over the first fin and the second fin;
    performing a first anneal at a first temperature and a first pressure while at least a portion of the silicon cap layer is exposed;
    forming source/drain features over source/drain regions of the first fin and the second fin;
    forming a gate structure over channel regions of the first fin and the second fin; and
    after the forming of the gate structure, performing a second anneal at a second temperature and a second pressure while no portion of the silicon cap layer is exposed;
    wherein the first temperature is greater than the second temperature,
    wherein the second pressure is greater than the first pressure.

11. The method of claim 10, wherein a germanium content in the first fin is between about 20% and about 60%.

12. The method of claim 10, wherein the forming of the silicon cap layer comprises depositing silicon using atomic layer deposition (ALD).

13. The method of claim 10, wherein the forming of the silicon cap layer comprises epitaxially growing silicon over the first fin and the second fin.

14. The method of claim 10, wherein the first temperature is between about 800° C. and about 1050° C., wherein the first pressure is between about 0.01 atmosphere (atm) and about 1.1 atm.

15. The method of claim 10, wherein the second temperature is between about 350° C. and about 450° C., wherein the second pressure is between about 10 atmosphere (atm) and about 20 atm.

16. The method of claim 10, wherein the gate structure comprises a high-k dielectric layer, a work function layer, and a metal fill layer.

17. A method, comprising:
    forming, on a substrate, a first fin comprising silicon and germanium;
    forming, on the substrate, a second fin comprising silicon;
    forming an isolation feature over the substrate and between the first fin and the second fin;
    after the forming of the isolation feature, forming a silicon cap layer over the first fin and the second fin; after the forming of the silicon cap layer, performing a first anneal at a temperature between about 800° C. and about 1050° C.;
    forming a gate structure over channel regions of the first fin and the second fin; and
    after the forming of the gate structure, performing a second anneal at a temperature between about 350° C. and about 450° C.

18. The method of claim 17, wherein the forming of the silicon cap layer comprises depositing silicon using atomic layer deposition (ALD).

19. The method of claim 17, wherein the forming of the silicon cap layer comprises epitaxially growing silicon over the first fin and the second fin.

20. The method of claim 8, wherein the forming of the isolation feature comprises:
   after the etching back, selectively removing the semiconductor nitride liner above the isolation feature.

* * * * *